United States Patent [19]
Mori et al.

[11] Patent Number: 4,816,699
[45] Date of Patent: Mar. 28, 1989

[54] SLICE AMPLIFIER USING FET'S

[75] Inventors: Masakazu Mori; Tetsuo Wada, both of Kawasaki; Yuji Miyaki, Yokohama; Kazuo Yamane, Kawasaki; Kazuhiro Suzuki, Kawasaki; Yoshinori Ohkuma, Kawasaki, all of Japan

[73] Assignee: Fujitsu Limited, Kawasaki, Japan

[21] Appl. No.: 94,680

[22] PCT Filed: Dec. 17, 1986

[86] PCT No.: PCT/JP86/00639
§ 371 Date: Oct. 9, 1987
§ 102(e) Date: Oct. 9, 1987

[87] PCT Pub. No.: WO87/04027
PCT Pub. Date: Jul. 2, 1987

[30] Foreign Application Priority Data
Dec. 20, 1985 [JP] Japan .............................. 60-287201
Jan. 14, 1986 [JP] Japan .............................. 61-004210

[51] Int. Cl.⁴ .............................................. H03K 5/08
[52] U.S. Cl. .................................... 307/268; 307/359; 307/546; 307/562; 307/264

[58] Field of Search ............... 307/264, 268, 359, 546, 307/553, 554, 555, 562, 568

[56] References Cited
U.S. PATENT DOCUMENTS
4,162,412 7/1979 Mawhinney et al. ............... 307/264

Primary Examiner—John Zazworsky
Attorney, Agent, or Firm—Staas & Halsey

[57] ABSTRACT

A slice amplifier using field effect transistors (FET's) is provided which is suitable for achieving a correct discrimination of logics "0" and "1" of an input signal ($S_{in}$) at very high speed by reshaping the input signal ($S_{in}$) into rectangular shaped pulses ($S_{out}$). The top and bottom of each pulse are determined to predetermined constant levels by using a first FET ($T_1$) and a second FET ($T_2$) with the aid of a first monitor and control unit (41) and second monitor and control unit (42). The first and second monitor and control units (41, 42) monitor the drain voltages of the first and second FET's ($T_1$, $T_2$) and control the gate-source voltages thereof, respectively, so as to realize the predetermined constant levels.

8 Claims, 7 Drawing Sheets

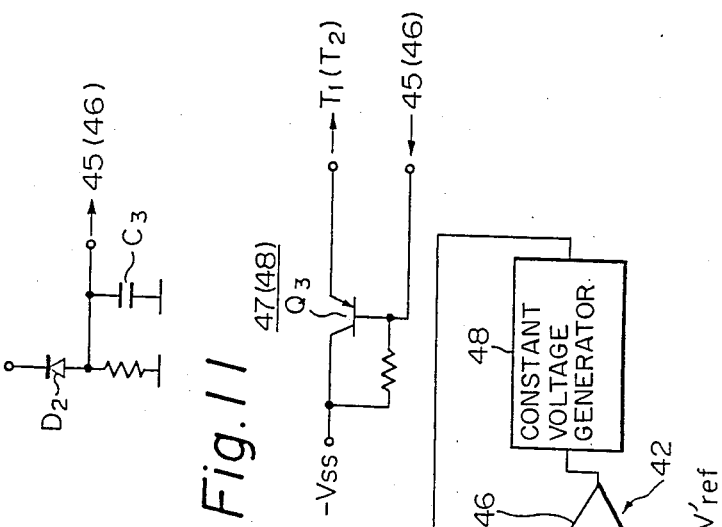
Fig. 10
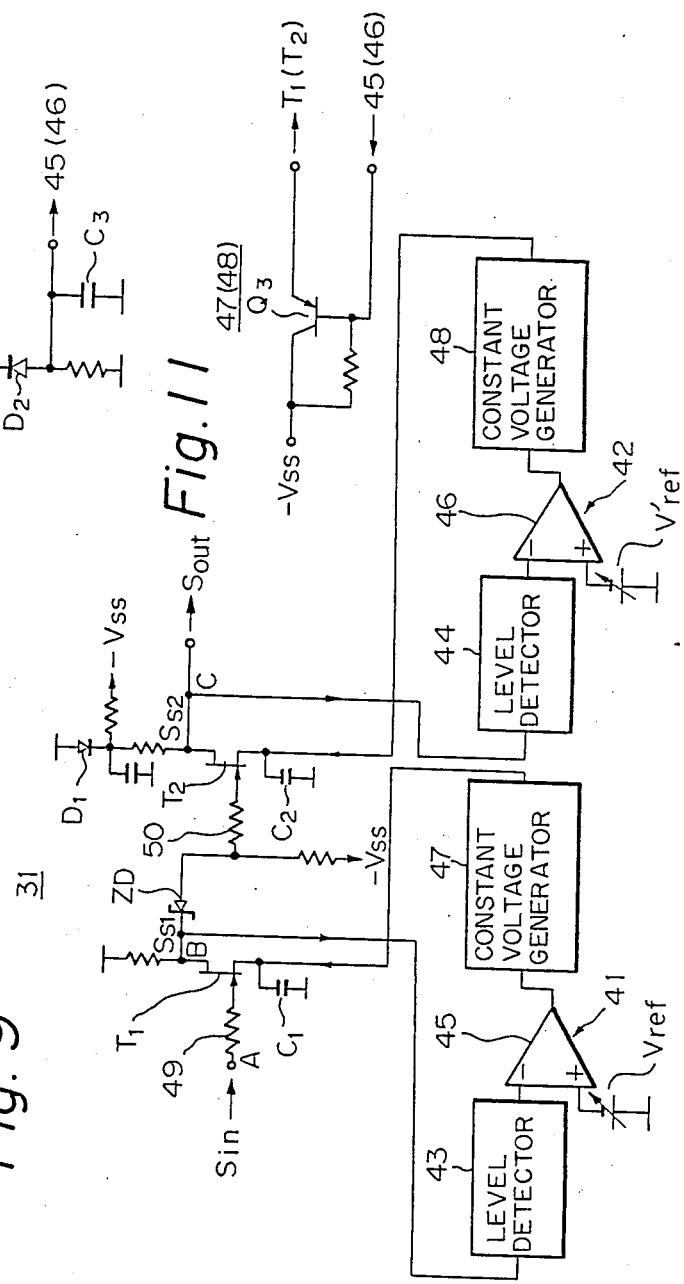
Fig. 11
Fig. 9

SLICE AMPLIFIER USING FET'S

TECHNICAL FIELD

The present invention relates to a slice amplifier using filed effect transistors (FETs).

A slice amplifier plays an important role as an element of a very high speed data transmission system. For example, the slice amplifier is mounted in a data discrimination unit at a transmitter side or a receiver side of a pulse code modulation (PCM) optical communication system. The data discrimination unit contains, for examples, a D-flip flop (FF) which produces logic "1" and "0" composing a base band data. At the D-FF, an input signal given to the D input terminal thereof, is sampled by a clock signal given to the C-input terminal thereof. In this case, if a phase deviation occurs in the input signal, it is difficult to correctly sample the input signal with a predetermined timing, and therefore, a data error will occur. Accordingly, the input signal is first sliced at a certain constant level, and then the peak-to-peak level is enlarged to obtain a rectangular-shaped waveform. In this case, the input signal can be discriminated to obtain correct data, even though a phase deviation has more or less occurred in the input signal. This is the function of the slice amplifier, which can be employed in a wave reshaping circuit.

BACKGROUND ART

FIG. 1 is a schematic diagram of a conventional data discrimination unit including a slice amplifier. In FIG. 1, an input signal $S_{in}$ is first received by a slice amplifier 11. The slice amplifier 11 constitutes, together with a wave reshaping part 12 following the amplifier 11, a data discrimination unit 10. The input signal $S_{in}$ is an analog signal having the waveforms as shown, and each waveform represents a data logic "0" or "1". Although the waveforms have already passed through an equalizer (not shown), each waveform still has a peak shape. Whether each mountain-shaped waveform represents a data logic "0" or "1" is determined by a waveform reshaping part 12, which is comprised of a D-flip flop (FF) for sampling each waveform by using a constant clock CLK. In this case, of course, the inherent digital output data $D_{out}$ can be reproduced if the waveform is correctly sampled by the clock CLK. If, however, the phase deviation occurs in the clock CLK, the clock timing cannot be aligned with the top of each peak of the waveform, and therefore, the clock samples the valley portion between the two adjacent peak waveforms, and thus a discrimination error is produced.

To overcome the problem of phase deviation, the waveform of the input signal $S_{in}$ is sliced at a certain level, for example, a level TH, and the thus-sliced signal is then transformed into a rectangular-shaped waveform signal which is an output signal $S_{out}$. Therefore, the data logic "1" can be correctly sampled even if there is a more or less phase deviation of the clock. Namely, the slice amplifier 11 achieves the aforesaid transformation of the signal, i.e., $S_{in} \rightarrow S_{out}$.

FIG. 2 is a circuit diagram illustrating an example of a prior art slice amplifier. The prior art slice amplifier 11 is comprised of a first bipolar transistor $Q_1$ receiving the input signal $S_{in}$ at its base, a second bipolar transistor $Q_2$ receiving a reference voltage $V_{ref}$ at its base, and producing the output signal $S_{out}$, and a constant current source CS, and thus forms, as a whole, a current switch.

The prior art slice amplifier of the bipolar transistor type shown in FIG. 2 can not cope with very high speed data transmission because, due to the operation limit of the bipolar transistor per se, the slice amplifier is limited to a data transmission maximum speed on the order of 500 Mb/s.

The present invention is based on the employment of a field effect transistor (FET), instead of the bipolar transistor, to abolish this operation limit. For example, a GaAs·FET or a high electron mobility transistor, so-called HEMT, can raise the operation limit up to the order of several G b/s. In view of this, the inventors have attempted to replace the bipolar transistors $Q_1$ and $Q_2$ in the slice amplifier with FETs.

FIG. 3 is a circuit diagram of a prototype slice amplifier using FETs. The slice amplifier 21 contains the FETs $T_1$ and $T_2$, instead of the bipolar transistors $Q_1$ and $Q_2$ contained in the slice amplifier 11. Note, the meanings of the characters $S_{in}$ (input signal), $S_{out}$ (output signal, i.e., sliced signal), CS (constant current source), and so on have been already explained.

The inventors, however, found that the slice amplifier 21 cannot be practically used. This is because, first, the variance of the pinch-off voltage ($V_p$) of each FET is too large, that is, the FETs have different pinch-off voltage ($V_p$) to each other, and second, the pinch-off voltage ($V_p$) per se is susceptible to variations of temperature.

FIG. 4 depicts characteristic curves in the $I_D$–$V_{GS}$ of an FET. This characteristic curve is typical for a usual FET. When the input signal $S_{in}$ is applied to the gate of the FET, the hatching portion thereof is cut away if the related FET has the characteristic curve I. Alternatively, if another FET having the characteristic curve II is used, the whole of the signal $S_{in}$ will be cut away. In general, the FET exhibits a characteristic curve, i.e., $I_D$–$V_{GS}$, which is analogous to that of a vacuum tube. In this case, the gate-source voltage $V_{GS}$ at the drain current $I_D$ of zero, i.e., the aforesaid pinch-off voltage, varies, in actuality, over a range as large as 1V through 4V in each FET. Due to this nonuniformity of the $I_D$–$V_{GS}$ characteristics, it is almost impossible to realize a current switch available for a slice amplifier. In the circumstance, it may be possible to eliminate the nonuniformity of the $I_D$–$V_{GS}$ characteristics by fabricating FETs on the same semiconductor chip in the form of an integrated circuit (IC). But, the slice amplifier is not inherently expected to be mass produced, and therefore, a problem arises in that the cost of the slice amplifier will increase due to the employment of the IC process.

Further, as another disadvantage, the pinch-off voltage is also susceptible to variations of temperature.

FIG. 5 depicts characteristic curves in the $I_D$–$V_{GS}$ of an FET in relation to a temperature variation. In FIG. 5, curves III, IV, and V represent $I_D$–$V_{GS}$ characteristics obtained at a low temperature, a median temperature (room temperature) and a high temperature. It is apparent that the curves are not uniform, and that the pinch-off voltage $V_p$ varies accordingly. Thus, the output signal $S_{out}$ with respect to the input signal $S_{in}$ is not stable.

A similar variation of the pinch-off voltage $V_p$ also occurs in response to a variation of a power source voltage.

DISCLOSURE OF THE INVENTION

In view of the above-mentioned problems, the object of the present invention is to provide a slice amplifier using FETs which can stably and correctly produce the output signal without being effected by, for example, variance of the pinch-off voltage in each FET, variance of the temperature, and variance of the power source voltage.

According to the present invention, there is provided a slice amplifier using FETs comprising: a first FET; a second FET; a first monitor and control unit; and a second monitor and control unit. The first FET slices the input signal at a first slice level, and the second FET slices the first sliced signal from the first FET at a second slice level, to produce a second slice signal. The first monitor and control unit controls the gate-source voltage $V_{GS}$ of the first FET so that the lower limit level of the first sliced signal is maintained at a predetermined first constant level. The second monitor and control unit controls the gate-source voltage $V_{GS}$ of the second FET so that the lower limit level of the second sliced signal is maintained at a predetermined second constant level. The second sliced signal is produced as an output signal from the slice amplifier.

BRIEF DESCRIPTION OF THE DRAWINGS

FIG. 9 is a circuit diagram of a slice amplifier according to a first embodiment of the present invention;

FIG. 10 is a circuit diagram illustrating an example of the lower limit level detector of FIG. 9;

FIG. 11 is a circuit diagram illustrating an example of the constant voltage generator of FIG. 9;

BEST MODE FOR CARRYING OUT THE INVENTION

Figure 6:
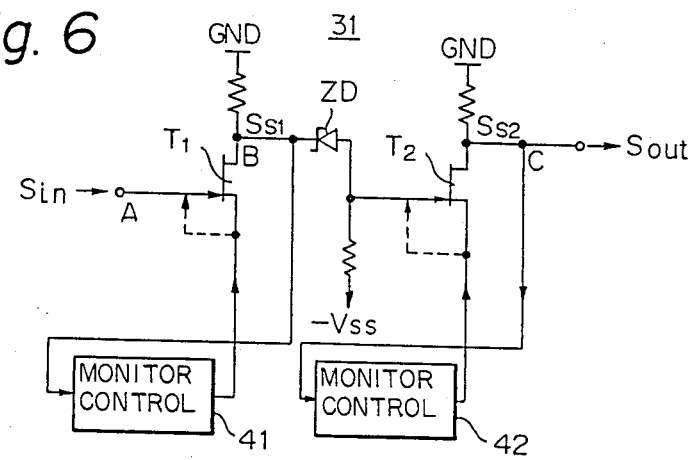
FIG. 6 is a circuit diagram illustrating a basic arrangement of a slice amplifier according to the present invention.

FIG. 6 is a circuit diagram illustrating a basic arrangement of a slice amplifier according to the present invention. In FIG. 6, a slice amplifier 31 is comprised of a first FET $T_1$, a second FET $T_2$, a first monitor and control unit 41, which monitors a first sliced signal $S_{s1}$ from the FET $T_1$ and controls the gate-source voltage $V_{GS}$ of the FET $T_1$, and a second monitor and control unit 42, which monitors a second sliced signal $S_{s2}$ from the FET $T_2$ and controls the gate-source voltage $V_{GS}$ of the FET $T_2$. The second sliced signal $S_{s2}$ per se is used as the output signal $S_{out}$ to be obtained. The first monitor and control unit 41 controls, as mentioned above, the gate-source volta $V_{GS}$ of the first FET $T_1$. Therefore, the unit 41 is not limited to control of the source voltage of the $FET_1$, as shown by a solid line, but also can control the gate voltage thereof, as shown by a broken line. This also holds true for the second monitor and control unit 42 in relation to the second FET $T_2$. This will be explained hereinafter.

The first FET $T_1$ receives the input signal $S_{in}$ at its gate and slices the waveform of the received signal $S_{in}$, the peak of which is higher than a first slice level ($SL_1$), and thereby obtains the first sliced signal $S_{s1}$. The signal $S_{s1}$ appears at the drain of the first FET $T_1$, and the drain output voltage is always monitored by the first monitor and control unit 41, which controls the source voltage of the FET $T_1$ so that the lower limit level of the drain output voltage of $T_1$ is maintained at a predetermined first constant level ($CL_1$).

The second FET $T_2$ receives the first sliced signal $S_{s1}$ at its gate, and slices the waveform of the signal $S_{s1}$, the peak of which is higher than a second slice level ($SL_2$), thereby obtaining a second sliced signal $S_{s2}$. The signal $S_{s2}$ appears at the drain of the second FET $T_2$, and the drain output voltage is always monitored by the second monitor and control unit 42 which controls the source voltage of the FET $T_2$ so that the lower limit level of the drain output voltage of $T_2$ is maintained at a predetermined second constant level ($CL_2$). Thus, the drain output voltage, i.e., the second sliced signal $S_{s2}$, is produced as the output signal $S_{out}$ of the slice amplifier 31. The above-mentioned operation will be further clarified with reference to the related waveforms.

Figure 7A:
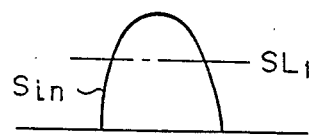
FIGS. 7A, 7B, and 7C depict waveforms of signals appearing at the portions A, B, and C indicated in the circuit of FIG. 6.
Figure 7B:
Figure 7C:
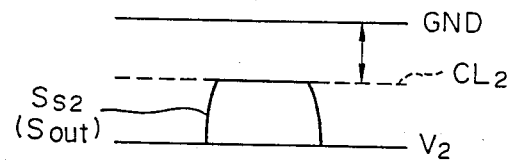
Figure 8A:
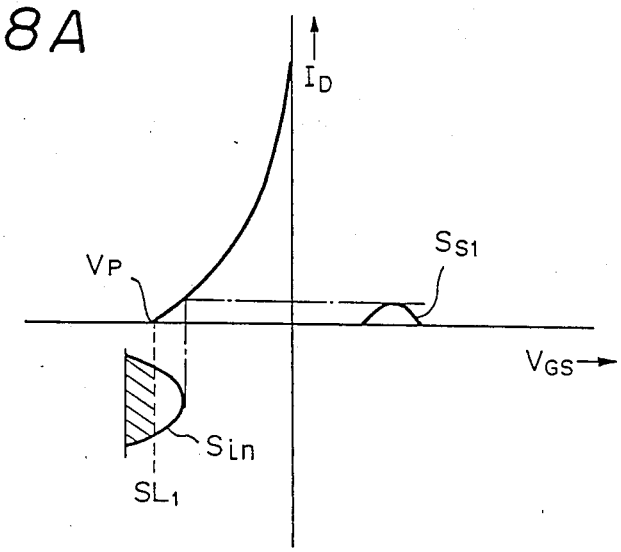
FIGS. 8A and 8B depict characteristic curves for explaining the waveforms shown in FIGS. 7A and 7C, respectively.
Figure 8B:
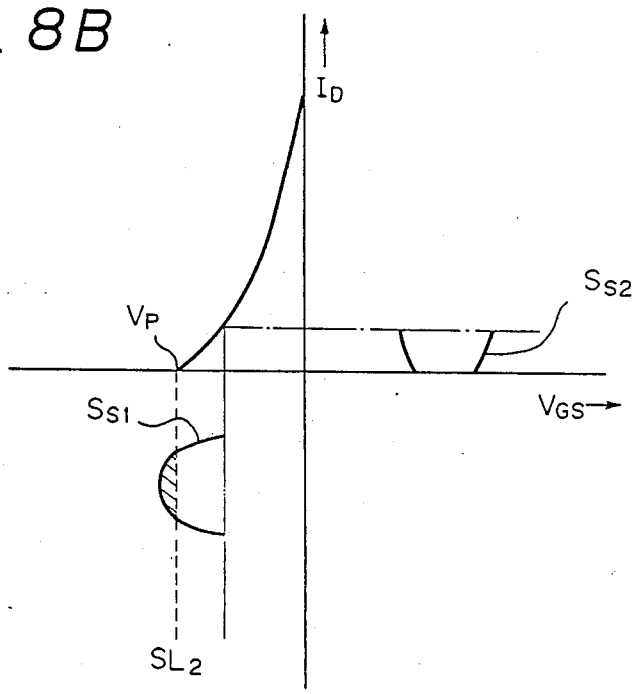

FIGS. 7A, 7B, and 7C depict waveforms of signals appearing at the portions A, B, and C indicated in the circuit of FIG. 6. FIGS. 8A and 8B depict characteristic curves for explaining the waveforms shown in FIGS. 7A and 7C, respectively. The input signal $S_{in}$ is sliced at the first slice level $SL_1$, as shown in FIGS. 7A and 8A. The slice level $SL_1$ is preferably determined as the pinch-off voltage $V_p$, as shown in FIG. 8A, and thus the first sliced signal $S_{s1}$ is produced in accordance with the characteristic curve ($I_D$–$V_{GS}$) of FIG. 8A. The lower limit level of the first sliced signal $S_{s1}$ is maintained at the first constant level $CL_1$, as shown in FIG. 7B, by the first monitor and control unit 41. Note, the first slice level $SL_1$ can be commonly used for the discrimination of the data logic "0" or "1" contained in the input signal $S_{in}$.

The first sliced signal $S_{s1}$ is then applied to the gate of the second FET $T_2$ and sliced at the second slice level $SL_2$ to produce the second sliced signal $S_{s2}$, as shown in FIG. 8B. The lower limit level of the second sliced signal $S_{s2}$ is maintained at the second constant level $CL_2$, as shown in FIG. 7C, by the second monitor and control unit 42. The second slice level $SL_2$ is preferably determined to be a level which is suitable as an input level of a logic circuit (not shown) which follows after the slice amplifier 31.

In FIGS. 7B and 7C, GND represents a ground level with respect to a power source level $-V_{ss}$, for example, $-12$ V. In FIG. 7B, the level $CL_1$ is, for example, $-1.6$ V. In FIG. 7C, the level $CL_2$ is, for example, $-1.6$ V, and the level $V_2$ is, for example, $-0.8$ V.

The above explanation has been made by taking a case where the lower limit level of the first sliced signal $S_{s1}$ is maintained at the first constant level $CL_1$, and the lower limit level of the second sliced signal $S_{s2}$ is maintained at the second constant level $CL_2$. Note, it is important to set the first and second sliced signals $S_{s1}$ and $S_{s2}$, as a whole, at a respective fixed potential.

FIG. 9 is a circuit diagram of a slice amplifier according to a first embodiment of the present invention. Members identical to those of previous figures are represented by the same reference numerals or characters. In the first embodiment, the first and second FETs $T_1$ and $T_2$ are provided, at their sources, with capacitors $C_1$ and $C_2$, respectively. The capacitors $C_1$ and $C_2$ are included in the monitor and control units 41 and 42 for receiving the respective source voltages which are grounded thereby in terms of AC voltage, and thus a high frequency characteristic is not deteriorated. The monitor and control units 41 and 42 have substantially the same construction. The only difference between the two is that the former contains a reference voltage source of $V_{ref}$, and the latter contains a reference voltage source of $V'_{ref}$. These reference voltages can be determined freely, but are later fixed once the respective suitable levels are determined. The reference voltages $V_{ref}$ and $V'_{ref}$ specify the lower limit levels of the first and second sliced signals $S_{s1}$ and $S_{s2}$, respectively. As can be seen from the monitor and control unit 41, the unit 41 is comprised of a first detection means, i.e., a lower limit level detector 43, a first comparison means, i.e., an error amplifier 45, and a constant voltage generation means, i.e., a constant voltage generator 47. The second monitor and control unit 42 has the same construction. That is, the unit 42 has a lower limit level detector 44, an error amplifier 46, and a constant voltage generator 48. Taking the first monitor and control unit 41 as an example, when the lower limit level of the drain output voltage of the FET $T_1$, i.e., the first sliced signal $S_{s1}$, goes lower (or higher) than the first reference voltage level ($V_{ref}$), the lower (or higher) error level is detected by the lower limit level detector 43 and the output from the detector 43 is amplified by the error amplifier 45 to apply the amplified error level to the control input of the constant voltage generator 47, which increases (or decreases) the source voltage of the FET$_1$ to increase (or decrease) the lower limit level of the signal $S_{s1}$, to thereby maintain the lower limit level at the first constant level $CL_1$. The above-mentioned operation also holds true for the second monitor and control unit 42, so as to maintain the lower limit level of the second sliced signal $S_{s2}$ at the second constant level $CL_2$. As apparent from the above description, the first and second monitor and control units 41 and 42, respectively, control the source voltages of the FETs $T_1$ and $T_2$.

In order to maintain the lower limit of each drain output voltage at a constant value, each source voltage of the FETs $T_1$ and $T_2$ is controlled so that each gate-source voltage $V_{GS}$ of the FETs $T_1$ and $T_2$ is controlled. With respect to the gate voltage of the FET $T_1$, the gate should be given a suitable voltage from an external source so as to exhibit the full characteristics of the FET $T_1$. However, regarding the gate voltage of the FET $T_2$, a suitable level can be assured by determining a zener diode voltage of the zener diode in accordance with the drain voltage of the FET $T_1$.

In FIG. 9, a zener diode ZD is inserted between the drain of the first FET $T_1$ and the gate of the second FET $T_2$, which zener diode ZD acts as a DC level shifter The diode ZD decreases the input level to be applied to the second FET $T_2$ by, for example about 5 V, to assure an optimum driving level for the second FET $T_2$.

Further, in FIG. 9, resistors 49 and 50 are connected to the gates of the first and second FETs $T_1$ and $T_2$. The resistor 49 (and the resistor 50) is a so-called gate resistor which is useful for preventing undesired oscillation of the first FET $T_1$ (and the second FET $T_2$). It is known that the input impedance of the FET often assumes a negative resistance, which may induce oscillation. The negative resistance is changed to a positive resistance by the addition of the resistor (49, 50).

Figure 1:
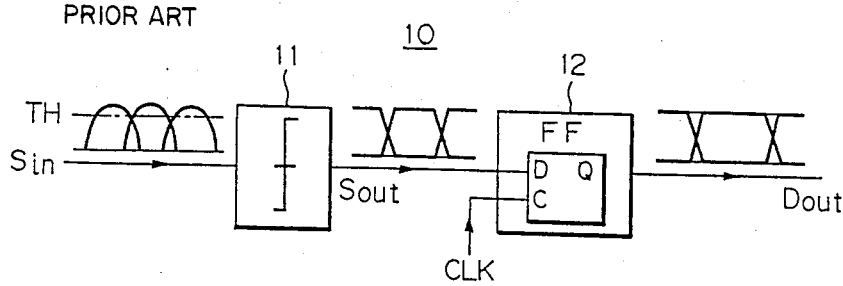
FIG. 1 is a schematic diagram of a conventional data discrimination unit including a slice amplifier.
Figure 2:
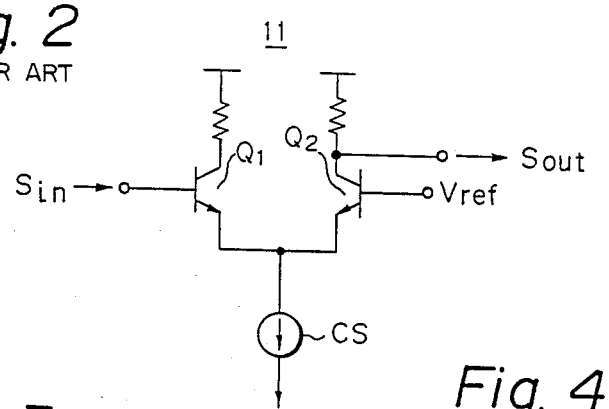
FIG. 2 is a circuit diagram illustrating an example of a prior art slice amplifier.
Figure 3:
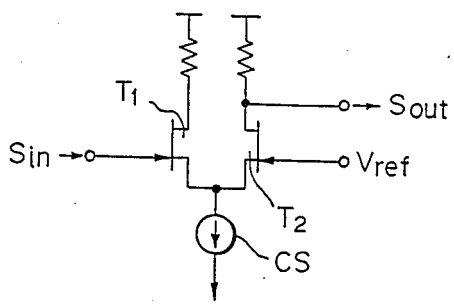
FIG. 3 is a circuit diagram of a prototype slice amplifier using FETs.
Figure 4:
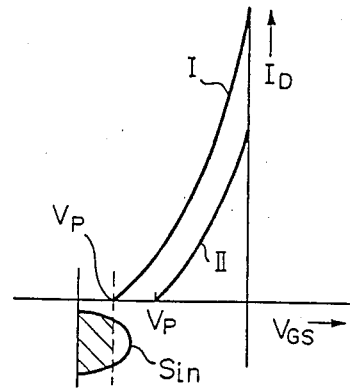
FIG. 4 depicts characteristic curves in the $I_D$–$V_{GS}$ of an FET.
Figure 5:
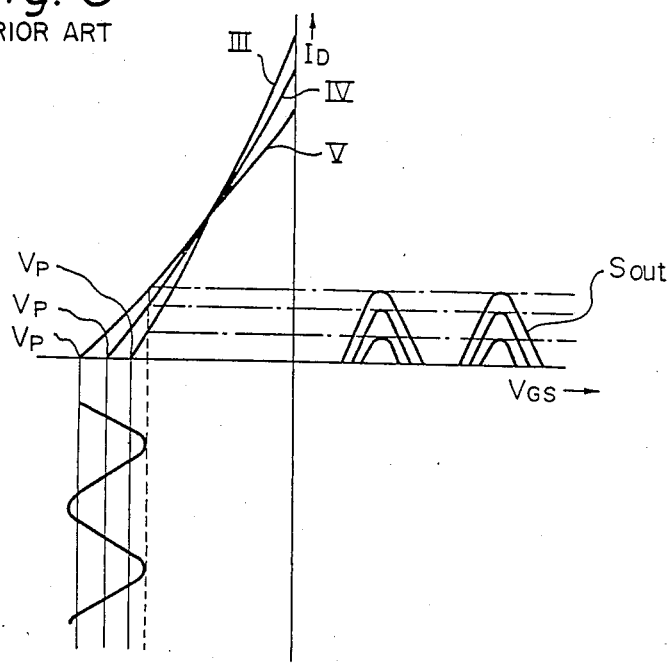
FIG. 5 depicts characteristic curves in the $I_D$–$V_{GS}$ of an FET in relation to temperature variations.

In FIG. 9, the second slice level ($SL_2$) is preferably determined to be a level suitable as an input level of a logic circuit, as mentioned previously. If the output signal $S_{out}$ is given to an emitter coupled logic (ECL) circuit, a diode $D_1$ is employed for the determination of the upper level of the output signal $S_{out}(V_2)$. The diode $D_1$ operates as a DC level shifter with, for example, $-0.8V$. Thus, the diode $D_1$ defines an upper limit level, i.e., $-0.8$ V, of a prescribed range ($-0.8V$ through $-1.6V$). The ECL circuit is a high speed logic circuit for forming the D-flip flop FF shown in FIG. 1.

The waveforms of signals appearing at the portions A, B, and C have already been displayed with reference to FIGS. 7A, 7B, and 7C.

FIG. 10 is a circuit diagram illustrating an example of the lower limit level detector of FIG. 9. In FIG. 10, the detector 43 (and the detector 44) is connected between the FET $T_1$ ($T_2$) and the error amplifier 45 (46). A diode $D_2$ is connected with the drain of the FET $T_1$ ($T_2$) and made conductive every time the cathode level becomes lower than the anode level, so that a capacitor $C_3$ is charged to hold each lower limit level of the signal $S_{s1}$. The charging voltage is applied to the error amplifier 45 (46).

FIG. 11 is a circuit diagram illustrating an example of the constant voltage generator of FIG. 9. In FIG. 11, the constant voltage generator 47 (and the generator 48) is connected between the error amplifier 45 (46) and the FET $T_1$ ($T_2$). As apparent from FIG. 11, the constant voltage generator 47 (48) is formed as a so-called series regulator having a transistor $Q_3$. The transistor $Q_3$ receives, at its base, the output from the error amplifier 45 (46) and maintains the source voltage of the FET $T_1$ ($T_2$) at a constant level.

Figure 12:
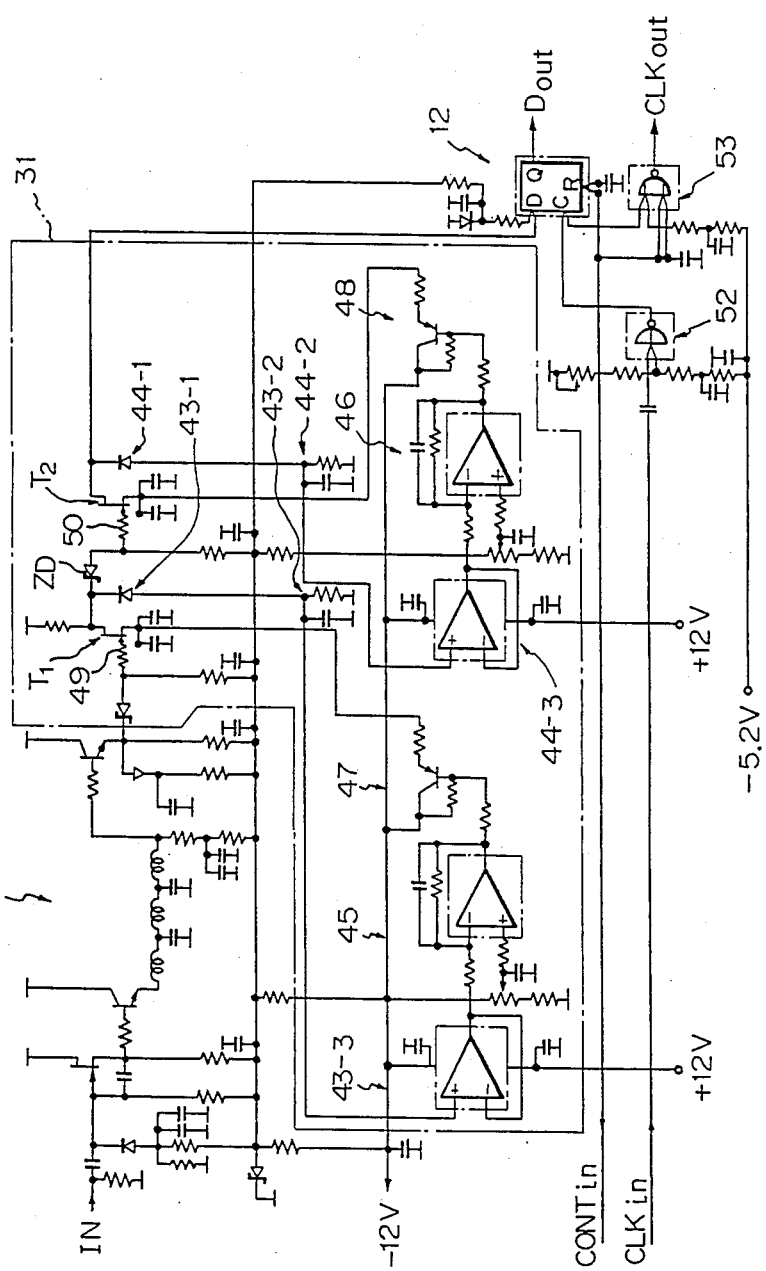
FIG. 12 is a detailed circuit diagram illustrating an example of an actual slice amplifier together with its peripheral circuit elements; and, FIG. 13 is a circuit diagram of a slice amplifier according to a second embodiment of the present invention.

FIG. 12 is a detailed circuit diagram illustrating an example of an actual slice amplifier together with its peripheral circuit elements. In FIG. 12, members corresponding to those previously explained are indicated by the same reference numerals or characters. An equalizer 51 is mounted at a stage preceding the slice amplifier 31. The waveform reshaping part 12 (FIG. 1) is mounted at a following stage thereof. Reference numerals 52 and 53 represent usual ECL gates. The majority of the slice amplifier 31 of FIG. 12 is the same as previously explained, the only difference being that buffer amplifiers 43-3 and 44-3 are positively illustrated in this figure. It should be understood that the lower limit level detector 43 (and the detector 44) are classified into three parts, 43-1, 43-2, and 43-3 (and the parts 44-1, 44-2, and 44-3).

Figure 13:
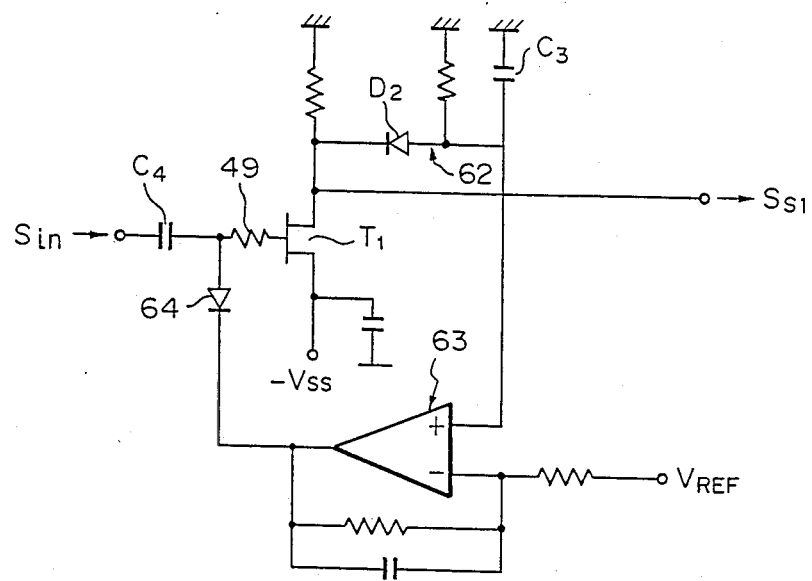

FIG. 13 is a circuit diagram of a slice amplifier according to a second embodiment of the present invention. The difference between the aforesaid first embodiment and the second embodiment is that, in the second embodiment, the gate-source voltage $V_{GS}$ of the FET is varied by controlling the gate voltage, not the source voltage as in the first embodiment. It should be understood that only an input side stage of the slice amplifier is illustrated for brevity. A monitor and control unit (corresponding to the first monitor and control unit 41)

is comprised of a level detector 62 and a comparator 63. The lower limit level of the drain voltage is detected by the level detector 62 and the thus-detected level is compared at the comparator 63, with the reference voltage $V_{ref}$, and the resultant error signal is fed back to the gate of the FET $T_1$ via a clamp diode 64, so that the lower limit level of the signal $S_{s1}$ is maintained at a constant level. The clamp diode 64 determines the aforesaid slice level, and a capacitor $C_4$ operates as a DC cut capacitor.

As explained above in detail, the slice amplifier using FETs can be put into practical use for high speed data transmission systems, such as a photo communication system, since the variances of the pinch-off voltage, the variance of the temperature, and the variance of the power source voltage are disregarded by the monitor and control units.

We claim:

1. A slice amplifier using field effect transistors (FETs) for discriminating between logic "0" and "1" of an input signal, said slice amplifier comprising:
   a first FET for receiving, at a gate thereof, an input signal and outputting, at a drain thereof, a portion of said input signal which is above a predetermined first slice level which is a pinch-off voltage of said first FET;
   a first monitor and control unit for receiving, from said first FET, a drain output as a first sliced signal and detecting a lower limit level of said first sliced signal to control a gate-source voltage of said first FET so that the thus-detected lower limit level is maintained at a predetermined first constant level;
   a second FET for receiving, at a gate thereof, a drain output from said first FET and outputting, at a drain of said second FET, a portion of said first sliced signal which is above a predetermined second slice level which is a pinch-off voltage of said second FET; and
   a second monitor and control unit for receiving, from said second FET, a drain output as a second sliced signal and detecting a lower limit level of said second sliced signal to control a gate-source voltage of said second FET so that the thus-detected lower limit level is maintained at a predetermined second constant level, said second sliced signal being produced as an output signal with respect to said input signal.

2. A slice amplifier using FETs as set forth in claim 1, wherein said first and second monitor and control units control each source voltage of said first and second FETs, respectively, and further maintain said first and second sliced signals at said first and second constant levels, respectively, while keeping each gate voltage of said first and second FETs at a fixed level.

3. A slice amplifier using FETs as set forth in claim 2, wherein said first and second monitor and control units, respectively, comprise:
   first and second detection means for detecting each lower limit level of said first and second sliced signals;
   first and second comparison means, coupled to said first and second detection means, for comparing said lower limit levels produced from said first and second detection means with first and second reference voltage levels for producing respective control signals; and
   first and second constant voltage generation means, connected to said first and second FETs, respectively, for supplying respective source voltages, in accordance with said respective control signals, said source voltages having levels such that said respective lower limit levels are equal to said first and second constant levels.

4. A slice amplifier using FETs as set forth in claim 2, wherein a zener diode for a DC level shift is inserted between a drain of said first FET and a gate of said second FET.

5. A slice amplifier using FETs as set forth in claim 2, wherein each gate of said first and second FETs, is provided with resistors for preventing undesirable oscillation of said first and second FETs.

6. A slice amplifier using FETs as set forth in claim 1, wherein said first slice level is determined to be a level for discriminating logics "0" and "1" of said input signal.

7. A slice amplifier using FETs as set forth in claim 1, wherein said second slice level is determined to be a level suitable as an input level of a logic circuit following said slice amplifier.

8. A slice amplifier using FETs as set forth in claim 1, further comprising a clamp diode wherein each of said monitor and control units monitoring a drain voltage of respective FETs and controlling a gate voltage thereof, by way of said clamp diode, to control of a gate-source voltage of said FETs.

* * * * *

UNITED STATES PATENT AND TRADEMARK OFFICE
CERTIFICATE OF CORRECTION

PATENT NO. : 4,816,699
DATED : MARCH 28, 1989
INVENTOR(S) : MASAKAZU MORI ET AL.

It is certified that error appears in the above-identified patent and that said Letters Patent is hereby corrected as shown below:

Col. 2, line 39, "pintch-off" should be --pinch-off--.

Col. 4, line 2, "volta" should be --voltage--.

Col. 5, line 65, after "shifter" insert a --.--.

Col. 6, line 31, after "$S_{S1}$" insert --($S_{S2}$).--.

Signed and Sealed this

Twenty-sixth Day of September, 1989

Attest:

DONALD J. QUIGG

*Attesting Officer*   *Commissioner of Patents and Trademarks*